(12) United States Patent
Drogi et al.

(10) Patent No.: US 8,866,548 B2
(45) Date of Patent: Oct. 21, 2014

(54) HIGH SPEED POWER SUPPLY SYSTEM

(71) Applicant: Quantance, Inc., San Mateo, CA (US)

(72) Inventors: Serge Francois Drogi, Flagstaff, AZ (US); Martin A. Tomasz, San Francisco, CA (US)

(73) Assignee: Quantance, Inc., San Mateo, CA (US)

( * ) Notice: Subject to any disclaimer, the term of this patent is extended or adjusted under 35 U.S.C. 154(b) by 0 days.

(21) Appl. No.: 14/098,248

(22) Filed: Dec. 5, 2013

(65) Prior Publication Data

US 2014/0091861 A1 Apr. 3, 2014

Related U.S. Application Data

(63) Continuation of application No. 13/777,516, filed on Feb. 26, 2013, now Pat. No. 8,604,875, which is a continuation of application No. 12/749,260, filed on Mar. 29, 2010, now Pat. No. 8,405,456.

(60) Provisional application No. 61/165,377, filed on Mar. 31, 2009.

(51) Int. Cl.
| | | |
|---|---|---|
| *H03G 3/20* | (2006.01) | |
| *G05F 1/575* | (2006.01) | |
| *H03C 1/00* | (2006.01) | |
| *H03F 1/02* | (2006.01) | |
| *H03F 3/20* | (2006.01) | |
| *H03F 3/189* | (2006.01) | |

(52) U.S. Cl.
CPC .............. *H03F 1/0211* (2013.01); *G05F 1/575* (2013.01); *H03C 1/00* (2013.01); *H03F 1/0233* (2013.01); *H03F 1/0222* (2013.01); *H03F 2200/411* (2013.01); *H03F 3/20* (2013.01); *H03F 3/189* (2013.01)
USPC ........................................... 330/127; 330/136

(58) Field of Classification Search
CPC ........... H03F 1/30; H03F 1/305; H03F 1/307; H03G 3/20; H03G 3/30; H03G 3/3036; H03G 3/3042
USPC .................................. 330/127, 136, 199, 297
See application file for complete search history.

(56) References Cited

U.S. PATENT DOCUMENTS

| | | |
|---|---|---|
| 3,671,846 A | 6/1972 | Corey |
| 3,900,823 A | 8/1975 | Sokal et al. |

(Continued)

FOREIGN PATENT DOCUMENTS

| | | |
|---|---|---|
| GB | 2409115 A | 6/2005 |
| JP | 55-157356 | 5/1982 |

(Continued)

OTHER PUBLICATIONS

United States Office Action, U.S. Appl. No. 13/385,406, Mar. 19, 2013, 6 pages.

(Continued)

*Primary Examiner* — Steven J Mottola
(74) *Attorney, Agent, or Firm* — Fenwick & West LLP

(57) ABSTRACT

A power supply system includes a high-speed power supply providing a first output, operating in conjunction with an externally supplied DC source or low frequency power supply which provides a second output. A frequency blocking power combiner circuit combines the first and second outputs to generate a third output in order to drive a load, while providing frequency-selective isolation between the first and second outputs. A feedback circuit coupled to the combined, third output compares this combined, third output with a predetermined control signal and generates a control signal for controlling the high-speed power supply, based on a difference between the third output and the predetermined control signal. The feedback circuit does not control the DC source or the low frequency power supply, but controls only the high-speed power supply.

26 Claims, 6 Drawing Sheets

(56) References Cited

U.S. PATENT DOCUMENTS

| | | | |
|---|---|---|---|
| 4,097,773 A | 6/1978 | Lindmark | |
| 4,292,581 A | 9/1981 | Tan | |
| 4,346,349 A | 8/1982 | Yokoyama | |
| 4,456,872 A | 6/1984 | Froeschle | |
| 4,636,927 A | 1/1987 | Rhyne et al. | |
| 4,686,448 A | 8/1987 | Jones et al. | |
| 4,697,160 A | 9/1987 | Clark | |
| 4,908,565 A | 3/1990 | Cook et al. | |
| 5,200,709 A | 4/1993 | Saito et al. | |
| 5,737,207 A | 4/1998 | Uratani et al. | |
| 5,905,407 A | 5/1999 | Midya | |
| 5,986,500 A | 11/1999 | Park et al. | |
| 6,028,476 A | 2/2000 | Schweighofer | |
| 6,084,468 A | 7/2000 | Sigmon et al. | |
| 6,097,614 A | 8/2000 | Jain et al. | |
| 6,130,525 A | 10/2000 | Jung et al. | |
| 6,175,273 B1 | 1/2001 | Sigmon et al. | |
| 6,191,653 B1 | 2/2001 | Camp, Jr. et al. | |
| 6,292,677 B1 | 9/2001 | Hagen | |
| 6,300,826 B1 | 10/2001 | Mathe et al. | |
| 6,518,856 B1 | 2/2003 | Casale et al. | |
| 6,529,073 B1 | 3/2003 | Highfill, III et al. | |
| 6,552,606 B1 | 4/2003 | Veltman et al. | |
| 6,580,258 B2 | 6/2003 | Wilcox et al. | |
| 6,594,163 B2 | 7/2003 | Tsai | |
| 6,597,242 B2 | 7/2003 | Petz et al. | |
| 6,639,816 B2 | 10/2003 | Liu | |
| 6,646,507 B1 | 11/2003 | Prokin et al. | |
| 6,654,261 B2 | 11/2003 | Welches et al. | |
| 6,661,210 B2 | 12/2003 | Kimball et al. | |
| 6,684,969 B1 | 2/2004 | Flowers et al. | |
| 6,711,034 B2 | 3/2004 | Duerbaum et al. | |
| 6,724,248 B2 | 4/2004 | Llewellyn | |
| 6,763,049 B1 | 7/2004 | Bees | |
| 6,774,719 B1 | 8/2004 | Wessel et al. | |
| 6,792,252 B2 | 9/2004 | Kimball et al. | |
| 6,825,726 B2 * | 11/2004 | French et al. | 330/297 |
| 6,984,969 B1 | 1/2006 | Liu et al. | |
| 7,058,373 B2 | 6/2006 | Grigore | |
| 7,113,038 B2 | 9/2006 | Putzeys | |
| 7,183,856 B2 | 2/2007 | Miki et al. | |
| 7,197,086 B2 | 3/2007 | Rauh et al. | |
| 7,454,238 B2 | 11/2008 | Vinayak et al. | |
| 7,547,995 B1 | 6/2009 | Andrews et al. | |
| 7,564,702 B2 | 7/2009 | Schlecht | |
| 7,583,065 B2 | 9/2009 | Xu et al. | |
| 7,583,149 B2 | 9/2009 | Funaki et al. | |
| 7,602,167 B2 | 10/2009 | Trafton et al. | |
| 7,671,699 B2 | 3/2010 | Wren | |
| 7,755,431 B2 | 7/2010 | Sun | |
| 7,764,054 B1 | 7/2010 | Guo et al. | |
| 7,859,336 B2 * | 12/2010 | Markowski et al. | 330/136 |
| 7,893,674 B2 | 2/2011 | Mok et al. | |
| 7,907,010 B2 | 3/2011 | Wendt et al. | |
| 7,907,014 B2 | 3/2011 | Nguyen et al. | |
| 7,921,309 B1 | 4/2011 | Isbister et al. | |
| 7,977,926 B2 | 7/2011 | Williams | |
| 8,008,902 B2 | 8/2011 | Melanson et al. | |
| 8,035,362 B2 | 10/2011 | Blanken | |
| 8,190,926 B2 | 5/2012 | Vinayak et al. | |
| 8,405,456 B2 | 3/2013 | Drogi et al. | |
| 8,553,434 B2 | 10/2013 | Coccia et al. | |
| 2003/0158478 A1 | 8/2003 | Petersen et al. | |
| 2004/0203982 A1 | 10/2004 | Barak et al. | |
| 2004/0263254 A1 | 12/2004 | Tahara et al. | |
| 2005/0064830 A1 | 3/2005 | Grigore | |
| 2006/0018136 A1 | 1/2006 | Takahashi | |
| 2007/0210771 A1 | 9/2007 | Wilson et al. | |
| 2008/0252380 A1 | 10/2008 | Blanken | |
| 2009/0044031 A1 | 2/2009 | Vinayak et al. | |
| 2009/0179698 A1 | 7/2009 | Ichitsubo et al. | |
| 2009/0184764 A1 | 7/2009 | Markowski et al. | |
| 2010/0250993 A1 | 9/2010 | Drogi et al. | |
| 2012/0194274 A1 | 8/2012 | Fowers et al. | |

FOREIGN PATENT DOCUMENTS

| | | |
|---|---|---|
| JP | 60-052607 | 11/1985 |
| JP | 01-137710 A | 5/1989 |
| JP | 04-129309 A | 4/1992 |
| JP | 2001-519612 | 10/2001 |
| JP | 2005-511065 A | 4/2006 |
| JP | 2008-537249 A | 9/2006 |
| WO | WO 99/18663 A1 | 4/1999 |
| WO | WO 2004/112236 A1 | 12/2004 |
| WO | WO 2005/027297 A2 | 3/2005 |
| WO | WO 2005/041404 A1 | 5/2005 |
| WO | WO 2006/021790 A1 | 3/2006 |
| WO | WO 2006/111891 A1 | 10/2006 |

OTHER PUBLICATIONS

Anderson, D.R. et al., "High-Efficiency High-Level Modulator for Use in Dynamic Envelope Tracking CDMA RF Power Amplifier," 2001, IEEE MTT-S Digest, pp. 1509-1512.

Dierburger, K. et al., "Simple and Inexpensive High-Efficiency Power Amplifier Using New APT MOSFETs," Nov. 1994, RF Expo East, 14 pages.

PCT International Search Report and Written Opinion, PCT Application No. PCT/US10/29256, Jun. 1, 2010, 12 pages.

Raab, F.H., "Split-Band Modulator for Kahn-Technique Transmitters," Microwave Symposium Digest, 2004 IEEE MTT-S International, Jun. 6-11, 2004, pp. 887-890, vol. 2.

Araujo, Samuel V., et al., "LCL Filter design for grid-connected NPC inverters . . . ", The 7th Intl. Conf. on Power Electronics, Oct. 22-26, 2007, pp. 1133-1138, EXCO, Daegu, Korea.

Chinese Office Action, Chinese Application No. 200780040407.5, Dec. 16, 2011, 7 pages.

Dadafshar, Majid, "Drive RF Power Amplifiers with a High-Frequency Switching Regulator", EDN, Oct. 7, 2010, pp. 22-27.

Erickson, Bob, "Resonant Power Conversion", Fundamentals of Power Electronics, Chapter 19, 1997, Colorado Power Electronics Center, University of Colorado, Boulder.

Erickson, Bob, "Quasi-Resonant Converters", Fundamentals of Power Electronics, Chapter 20, 1997, Colorado Power Electronics Center, University of Colorado, Boulder.

European Examination Report, European Application No. 07813597.7, Nov. 10, 2011, 5 pages.

European Extended Search Report, European Application No. 07813597.7, Jul. 5, 2010, 12 pages.

Hamill, David C., et al., "A 'Zero' Ripple Technique Applicable to any DC Converter", PESC, IEEE, 1999, pp. 1165-1171, vol. 2.

International Search Report and Written Opinion, PCT/US07/74869, Jul. 29, 2008, 6 pages.

Japanese Office Action, Japanese Patent Application No. 2009-534729, Mar. 19, 2012, 4 pages.

Japanese Office Action, Japanese Application No. 2009-534729, Sep. 16, 2011, 7 pages.

Korean Office Action, Korean Patent Application No. 10-2009-7009869, Dec. 6, 2010, 6 pages.

Li, Yushan, et al., "High Efficiency Wide Bandwidth Power Supplies for GSM and EDGE RF Power Amplifiers", ISCAS, 2005, pp. 1314-1317, vol. 2.

Patterson, Oliver D., et al., "Pseudo-Resonant Full Bridge DC/DC Converter", IEEE Transactions on Power Electronics, Oct. 1991, pp. 671-678, vol. 6, No. 4.

Phinney, Joshua, et al., "Filters with Active Tuning for Power Applications", IEEE Transactions on Power Electronics, Mar. 2003, pp. 636-647, vol. 18, No. 2.

Raoufi, Mustapha, et al., "Average Current Mode Control of a Voltage Source Inverter Connected to the Grid: . . . ", J. of Electrical Eng., 2004, pp. 77-82, vol. 55, No. 3-4.

Third Party Submissions, European Patent Application No. 07813597.7, Apr. 21, 2010, 5 pages.

Wang, Feipeng, et al., "An Improved Power-Added Efficiency 19-dBm Hybrid Envelope . . . ", IEEE Trans. on Microwave Theory and Techniques, Dec. 2006, pp. 4086-4099, vol. 54, No. 12.

Williams, Jim, "A Monolithic Switching Regulator with 100 .mu.V Output Noise", Linear Technology, Application Note 70, Oct. 1997.

(56) References Cited

OTHER PUBLICATIONS

United States Office Action, U.S. Appl. No. 12/249,717, Feb. 15, 2011, 7 pages.
United States Office Action, U.S. Appl. No. 12/249,717, Nov. 29, 2011, 13 pages.
U.S. Appl. No. 13/385,405, filed Feb. 17, 2012, Inventor David C.G. Tournatory et al.
U.S. Appl. No. 13/385,406, filed Feb. 17, 2012, Inventor David C.G. Tournatory et al.
United States Office Action, U.S. Appl. No. 12/749,260, Jul. 11, 2012, 6 pages.
"BJT Differential Amplifier," eCircuit Center, 2004, pp. 1-5, [Online] [Retrieved on Mar. 21, 2013], Retrieved from the Internet<URL:http://www.ecircuitcentercom/Circuits/BJT.sub.—Diffamp1.—htm.
PCT International Search Report and Written Opinion, PCT Application No. PCT/US2013/024799, Apr. 22, 2013, 14 pages.
United States Office Action, U.S. Appl. No. 13/777,516, Apr. 24, 2013, 6 pages.

\* cited by examiner

HIGH SPEED POWER SUPPLY SYSTEM

CROSS-REFERENCE TO RELATED APPLICATIONS

This application is a continuation of and claims priority under 35 U.S.C. §120 to U.S. patent application Ser. No. 13/777,516, entitled "High Speed Power Supply System," filed on Feb. 26, 2013, which claims priority from U.S. patent application Ser. No. 12/749,260, entitled "High Speed Power Supply System," filed on Mar. 29, 2010 and now issued as U.S. Pat. No. 8,405,456, which claims priority under 35 U.S.C. §119(e) from U.S. Provisional Patent Application No. 61/165,377, entitled "High Speed Power Supply System," filed on Mar. 31, 2009, all of which are incorporated by reference herein in their entirety.

BACKGROUND OF THE INVENTION

1. Field of the Invention

The present invention relates to a high speed power supply system that can be used to power an RF PA (Radio Frequency Power Amplifier).

2. Description of the Related Arts

In certain electronic systems, there is a need for a high-speed power supply to complement an existing DC source or low frequency power supply. As an illustrative example, a radio system may include an EER (envelope elimination and restoration) transmitter, where the RF PA is fed by a power supply which modulates the PA's power supply voltage or bias, imposing amplitude modulation onto the RF carrier signal. Typically, the power supply feeding such a PA is a linear regulator with a fast response, with the output voltage of the linear regulator controlled electronically to generate the amplitude modulation. Such a linear regulator is inefficient, as linear regulators control the output voltage via a dissipative pass transistor. A more efficient alternative could be to use a switching regulator. Often, in the case of portable battery-operated electronic devices such as mobile phones, spare switching regulators already exist within the system. However, these switching regulators lack the control bandwidth to modulate their output voltage at the rate needed to impose amplitude modulation in many modern radio systems, and therefore are not appropriate as modulators on their own.

SUMMARY OF THE INVENTION

Embodiments of the present invention include a power supply system comprising a high-speed power supply providing a first output, operating in conjunction with an externally supplied DC source or low frequency power supply which provides a second output. A frequency blocking power combiner circuit combines the first and second outputs to generate a third output in order to drive a load, while providing frequency-selective isolation between the first and second outputs. A feedback circuit coupled to the combined, third output compares this combined, third output with a predetermined control signal and generates a control signal for controlling the high-speed power supply, based on a difference between the third output and the predetermined control signal. The feedback circuit does not control the DC source or the low frequency power supply, but controls only the high-speed power supply. The power supply system has the benefit of minimizing cost by harnessing an existing DC source or low frequency power supply to provide a significant portion of power to the load, while increasing the control speed and accuracy of the power supply by adding a high-speed power supply controlled in a closed-loop manner. The high-speed power supply can be a push-pull regulator.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments of the present invention can be readily understood by considering the following detailed description in conjunction with the accompanying drawings.

DETAILED DESCRIPTION OF EMBODIMENTS

The figures and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Generally, a power supply system according to the present invention comprises a high-speed power supply providing a first output, operating in conjunction with an externally supplied DC source or low frequency power supply which provides a second output. A frequency blocking power combiner circuit combines the first and second outputs to generate a third output in order to drive a load, while providing frequency-selective isolation between the first and second outputs. A feedback circuit coupled to the combined, third output compares this output to a predetermined control signal and generates a control signal for controlling the high-speed power supply, based on a difference between the third output and the predetermined control signal. Note that the feedback circuit does not control the DC source or the low frequency power supply and only controls the high-speed power supply. The high-speed power supply can be a push-pull regulator.

The power supply is efficient with sufficient control bandwidth to impose amplitude modulation in an EER transmitter. The power supply system also has the benefit of minimizing cost by harnessing an existing DC source or low frequency power supply (e.g., battery voltage) to provide a significant portion of power to the load, while increasing the control speed and accuracy of the power supply by adding a high-speed power supply controlled in a closed-loop manner.

Figure 1A:
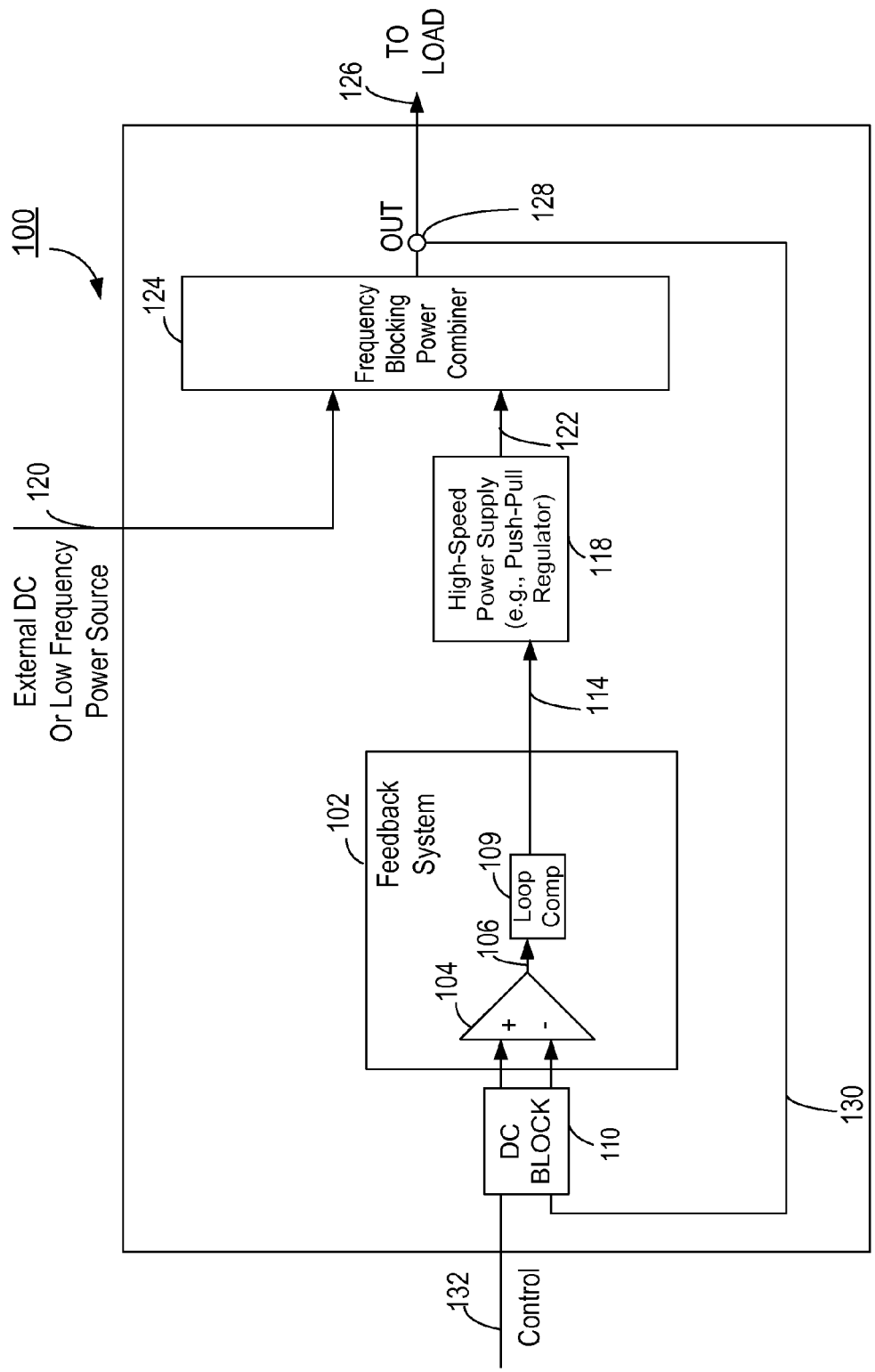
FIG. 1A illustrates a high speed power supply system, according to one embodiment.

Turning to the figures, FIG. 1A illustrates a high speed power supply system 100 according to one embodiment. The high speed power supply 118 may be a push-pull regulator in one embodiment. Power 120 from an external DC source or low frequency power supply is combined with the output power 122 of a high-speed power supply 118 in frequency blocking power combiner 124 to produce combined output power 126. The lowest frequency of the frequency range of output power 122 from the high-speed power supply 118 is at least higher than the lowest frequency of the frequency range of the DC or lower frequency power source 120. A connection 128 provides feedback 130 from output 126 to error amplifier 104. The feedback system 102 includes an error amplifier 104 comparing the feed back signal 130 with control signal 132 to generate power supply control signal 106. Control signal 132 controls the portion of the power supply that is generated by high-speed power supply 118, and may be generated from a baseband DSP (Digital Signal Processor) in the case of an EER system for a mobile device such as a cellular telephone. Loop compensation block 109 may be comprised of an electronic network providing lead- or lag-phase compensation, gain, or some combination thereof to ensure overall loop stability. Loop compensation block 109 receives power supply control signal 106 and generates such compensated power supply control signal 114. DC blocking module 110 prevents DC components from entering feedback system 102 and thus prevents DC levels from limiting the dynamic range of the signal chain fed to the high-speed power supply 118. Note that DC blocking module 110 may be moved to other locations within the circuit 100, replaced by other circuitry that reduces or eliminates DC components in the feedback system 102, or removed altogether if the design of the feedback system 102 and high-speed power supply 118 can tolerate DC components in the signal path. Feedback system 102 is a negative feedback system. If the feedback signal 130 is higher than control signal 132, error amplifier 104 generates control signal 114 to decrease the output power 122 of high speed power supply 118. On the other hand, if the feedback signal 130 is lower than control signal 132, error amplifier 104 generates control signal 114 to increase the output power 122 of high speed power supply 118. Thus, feedback system 102 forms a negative feedback system together with feedback signal 130.

Figure 1B:
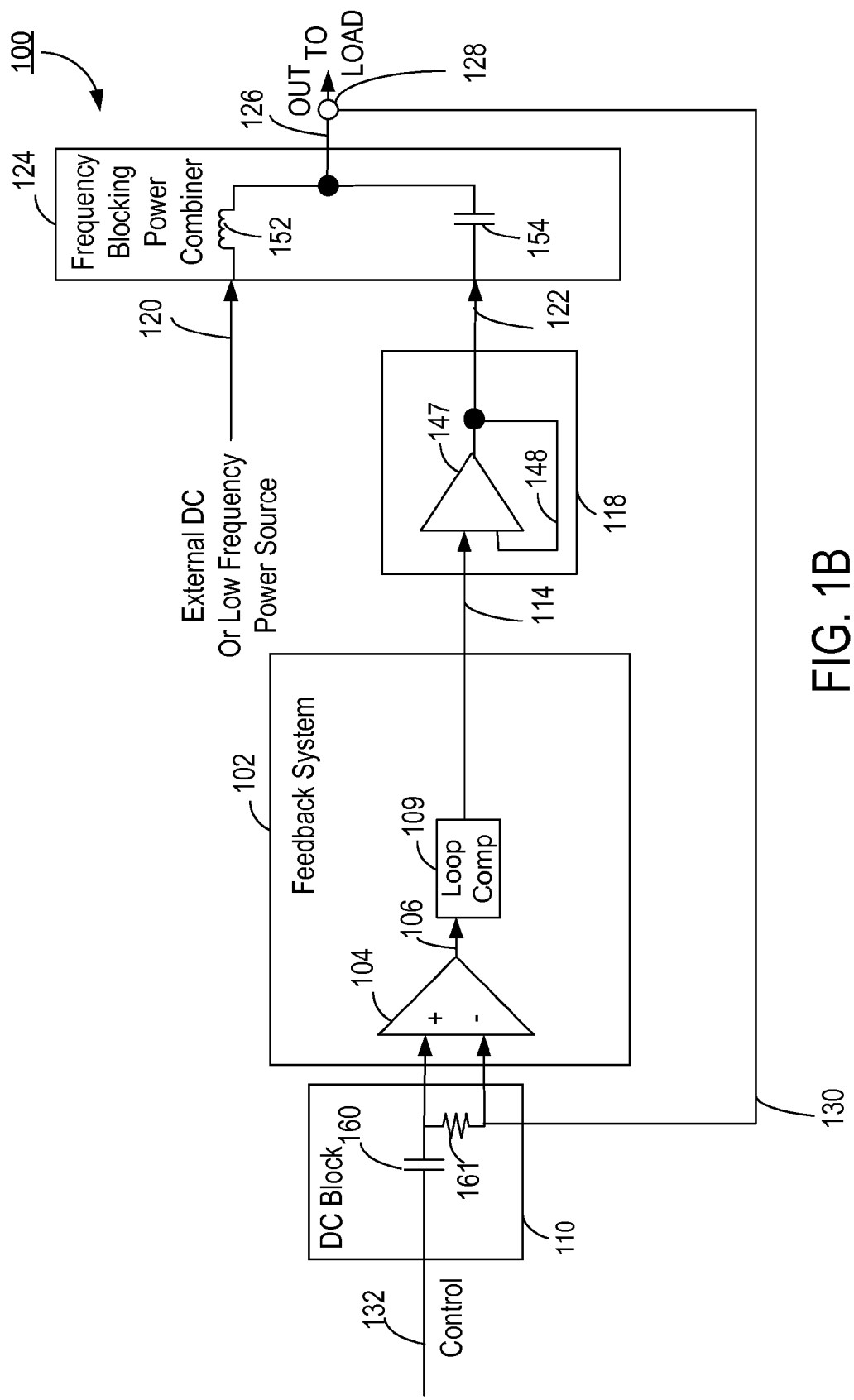
FIG. 1B illustrates additional details of the high speed power supply system of FIG. 1A, according to another embodiment.

FIG. 1B shows additional details of the high speed power supply system 100 of FIG. 1A, according to one embodiment. The DC blocking module 110 may include resistor 161 and capacitor 160 to block DC components of control signal 132 across the inputs of error amplifier 104. High-speed power supply 118 may be a push-pull type amplifier 147 with local feedback 148 to provide fixed gain. The signal 114 which feeds the push-pull type amplifier 147 may be level-translated (not shown) to a DC level suitable for the common-mode needs of push-pull type amplifier 147. Frequency blocking power combiner 124 may include a capacitor 154 coupled in series with the output 122 from high-speed power supply 118, and an inductor 152 coupled in series with the output 120 from the externally supplied DC source or low frequency power supply. The inductor 152 passes power at DC or low frequencies, while the capacitor 154 passes power at high frequencies and blocks DC and low frequencies. An important aspect of the frequency blocking power combiner network 124 is that inductor 152 isolates the high frequency power present at outputs 126, 122 from entering external source 120. Most DC or low frequency sources include large bypassing capacitors (not shown); if high speed power supply 118 were to drive these capacitors at high frequencies, the high-speed power supply 118 would have to generate high current into and out of these capacitors, resulting in significant power loss and loss in efficiency. Inductor 152 prevents this from happening by isolating the high frequency power present at output 126 from entering external source 120.

Figure 1C:
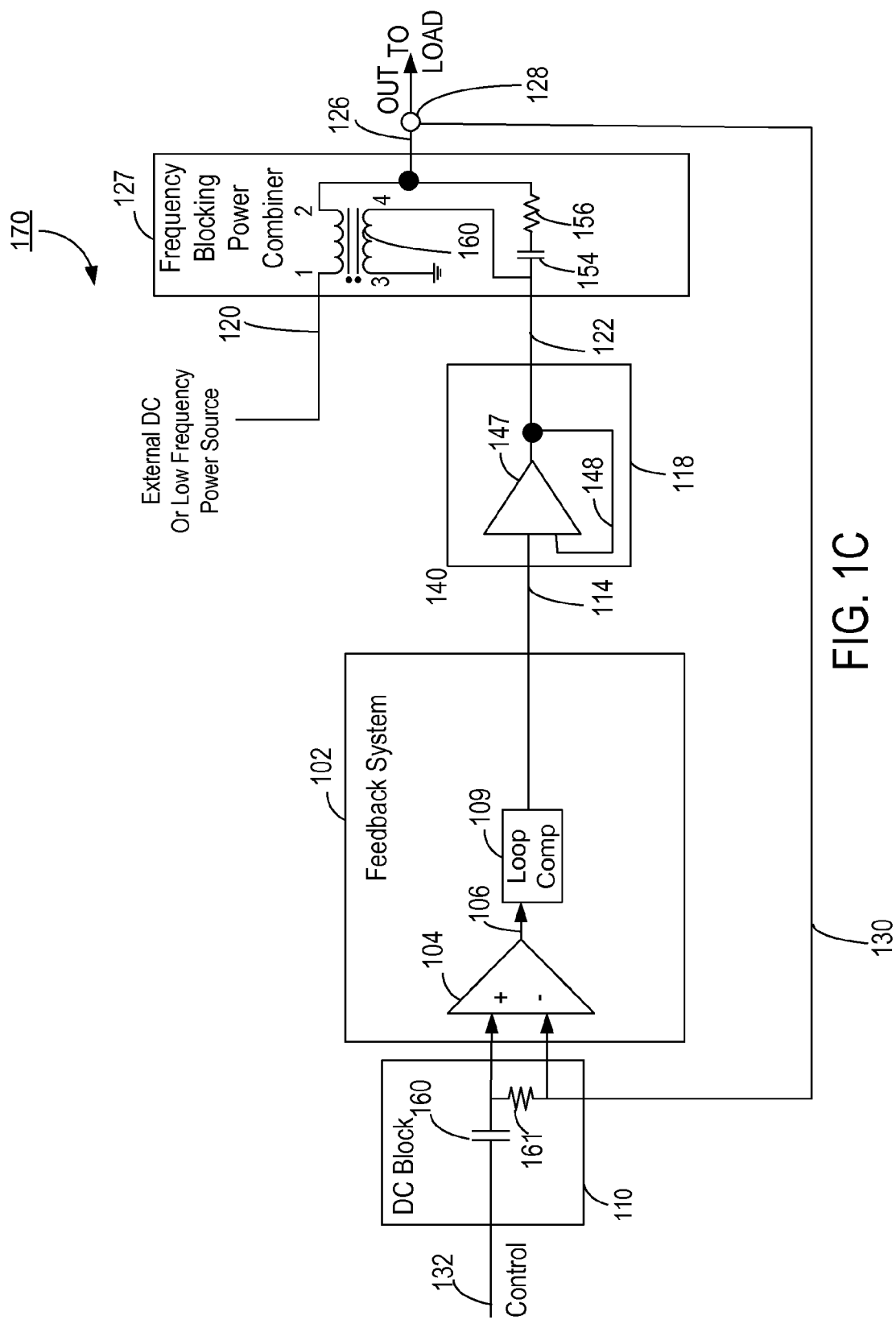
FIG. 1C shows additional details of the high speed power supply system of FIG. 1A, according to still another embodiment.

FIG. 1C shows additional details of high speed power supply system of FIG. 1A, according to still another embodiment. The power supply system 170 shown in FIG. 1C is substantially the same as the power supply system 100 shown in FIG. 1B, except that the frequency blocking power combiner 127 in this embodiment is comprised of the transformer 160, capacitor 154, and resistor 156. Transformer 160 isolates high frequency power at the output 122 of high-speed power supply (linear regulator) 118 from entering external DC/low frequency power source 120. The frequency blocking power combiner 127 also includes a capacitor 154 and a resistor 156 connected in series with the output 122 of the high-speed regulator 147. The capacitor 154 is used to compensate for the leakage inductance at the primary side (nodes 1 and 2) of transformer 160, by resonating this leakage inductance with the capacitor 154. The resistor 156 flattens the frequency response created by capacitor 154.

Note that a DC connection exists between the output 122 of high-speed power supply 118 and ground. Thus, the design of high-speed power supply 118 accommodates for this. For example, the output stage of high-speed power supply 118 may require AC-coupling, or a supply arrangement that allows a DC common-mode point of 0V.

Figure 2:
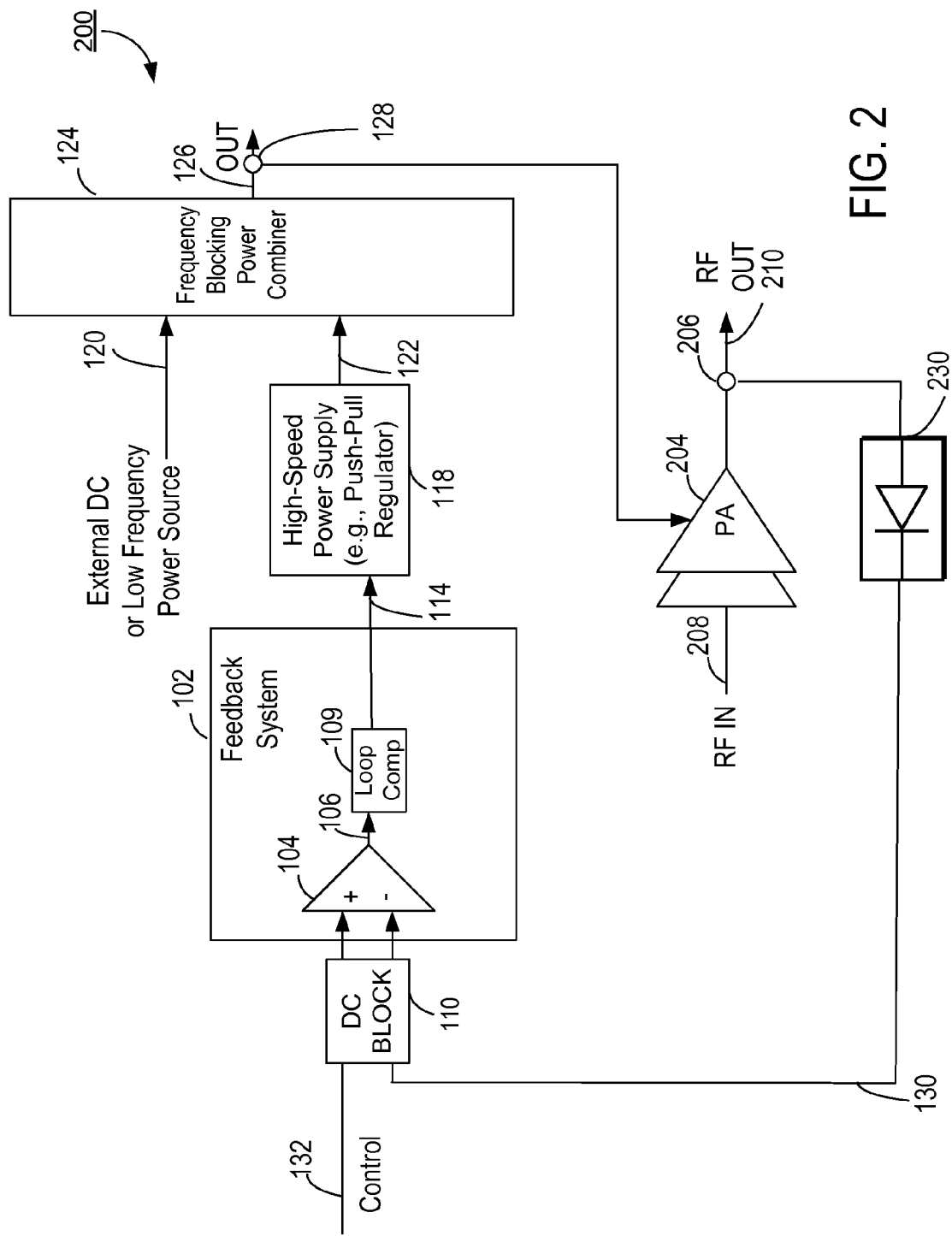
FIG. 2 illustrates a different variation of the power supply system, according to still another embodiment.

FIG. 2 illustrates a different variation of the power supply system, according to still another embodiment. The power supply system 200 of FIG. 2 is substantially the same as the power supply system 100 of FIG. 1A, except (i) that the output 126 of the power supply system 200 is used as the supply voltage to an RF PA 204 that receives and amplifies an RF input signal 208 and generates an RF output signal 210, and (ii) that the RF output signal 210 is sensed 206 and provided to a RF detector 230 to derive the amplitude signal 130, which in turn is fed back to feedback system 102. RF input signal 208 may be an RF signal for a mobile device to transmit, and thus will be a modulated signal containing amplitude modulation information, phase modulation information, and/or a combination of both. Thus, external control 132 controls the AC portion of the amplitude modulation of PA 204 and its RF output signal 210 in a closed-loop manner, while external DC or low frequency power source 120 sets the DC or low frequency portion of the amplitude modulation of PA 204 and its RF output signal 210. In practice, the voltage at power source 120 may be adjusted to set the average power of PA 204, while the amplitude of control signal 132 is set to an appropriate level for this given average power. The control of power source 120 and control signal 132 may be set by DACs (digital-to-analog converters, not shown) included in a digital signal processor (not shown) which generates the modulation of the RF output signal 210. In one embodiment, the power 120 from external DC or low frequency power source may be adjusted responsive to the average power output by the power amplifier 104.

Figure 3A:
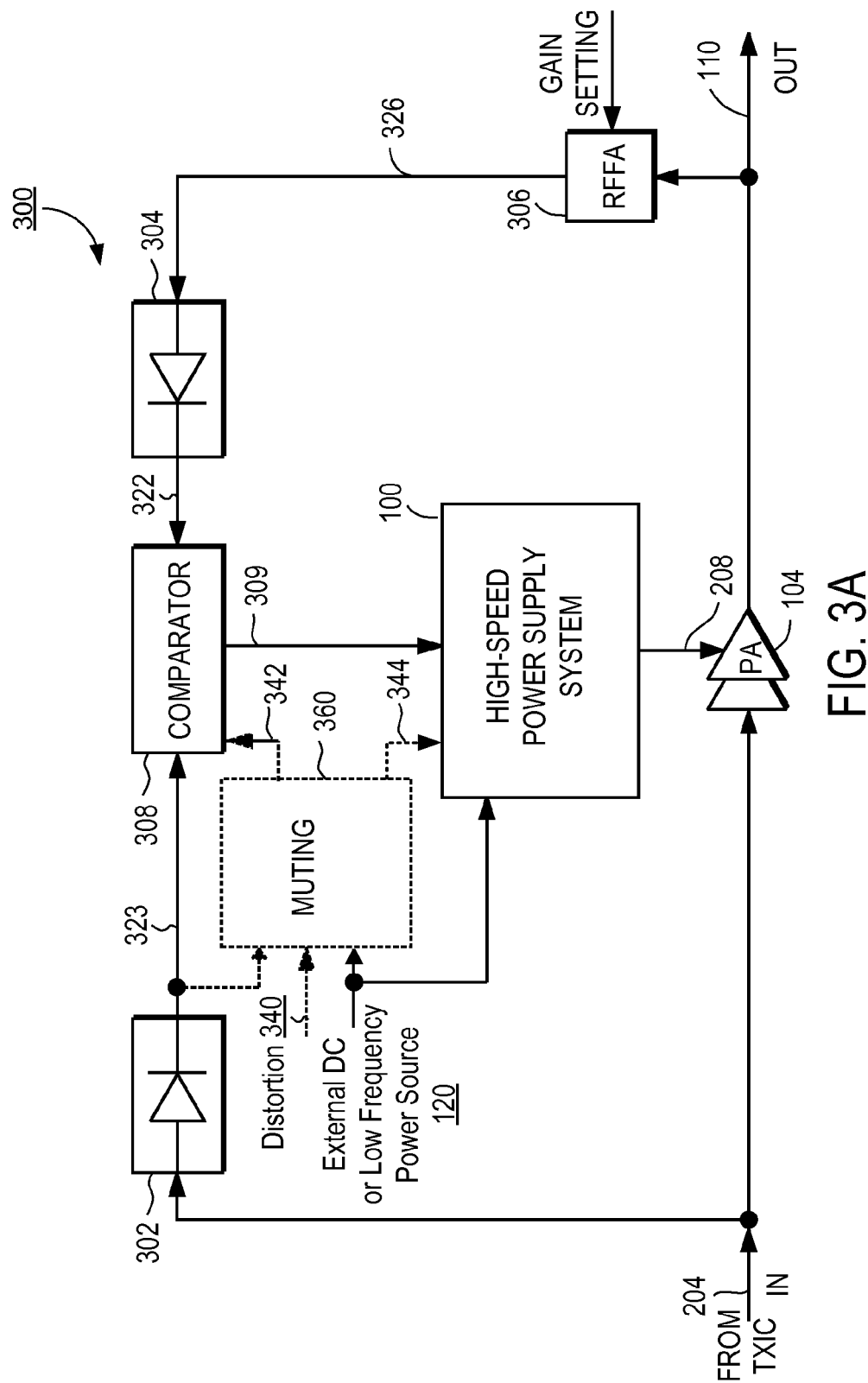
FIG. 3A illustrates a different variation of the power supply system for powering an RF PA circuit, according to still another embodiment.

FIG. 3A illustrates a different variation of the power supply system for powering an RF PA circuit, according to still another embodiment. High-speed power supply system 100 is included in a control system 300 that is essentially an amplitude correction loop to improve the linearity of PA 104 and allow the PA 104 to operate into compression, thus efficiently increasing the linear power available from PA 104. The amplitude correction loop is comprised of various components including the amplitude detectors 302, 304, comparator 308, and high-speed power supply system 100, powering 208 the PA 104. The amplitude correction loop adjusts the power supply voltage 208 to PA 104 based on an amplitude correction signal 309, which in turn is derived from the difference in amplitudes between RF input signal 204 and the RF output signal 110. RF input signal 204 may be an RF signal for a mobile device to transmit, and thus will be a modulated signal containing amplitude modulation information, phase modulation information, and/or a combination of both. Detectors 302 and 304 determine the amplitudes of RF input signal 204 and an attenuated version 326 of RF output signal 110 (attenuated by attenuator (RFFA) 306), respectively, feeding comparator 308 with amplitude signals 323 and 322, respectively. Comparator 308 generates an amplitude correction signal 309 based on the difference or ratio of amplitude signals 323 and 322. The amplitude correction signal 309 may connect to control signal 132 in high-speed power supply system 100 (FIG. 1A), while an external DC or low frequency power source connects to input 120. The external DC source 120 may be a direct connection to a battery of a mobile device or other electronic device, or may be derived from a switching regulator. In one embodiment, the power 120 from external DC or low frequency power source may be adjusted responsive to the average power output by the power amplifier 104.

When the RF input signal 204 to PA 104 is relatively low, and PA 104 operates substantially below its compression point, comparator 308 reports low error in amplitude correction signal 309, and thus the high-speed power supply 118 in the high-speed power supply system 100 is essentially inactive, while the external DC or low frequency source 120 provides pass-through power to the PA 104. As the RF input signal 204 to PA 104 is increased, the amplitude distortion caused by PA 104 is increased, and high-speed power supply 118 in the high-speed power supply system 100 reacts to the error reported in amplitude correction signal 309 by comparator 308, by providing a correcting AM modulation to the power supply 208 of PA 104. Thus, the amplitude error of PA 104 is corrected in a closed-loop manner. Capacitor 154 (see FIG. 1B) in high-speed power supply system 100 charges to the DC (average) voltage between combined output 126 and high-speed power supply output 122, allowing the supply voltage 208 supplied to PA 104 to swing above the voltage supplied by the external DC or low frequency source 120, thus providing the substantial benefit of a boosted AC supply without requiring a costly boost converter.

Muting block 360, which is optional, has circuitry for providing a means to reduce or stop the action of the amplitude correction loop when not needed, thus easing the dynamic range required for the amplitude correction loop, and potentially saving quiescent power when the system 300 would otherwise be idling. For example, when the amplitude 323 of RF signals passing through PA 104 is low (detected amplitude 323 is low, for example, lower than a predetermined threshold), muting block 360 may reduce or mute the output 309 of comparator 308 by use of a mute control signal 342, and/or shut down the high-speed power supply 118 within the high-speed power supply system 100 by use of a shut-down control signal 344. Alternatively, the distortion 340 of RF output signal 110 may be determined by an independent means (for example, error-vector magnitude evaluated by a DSP, not shown), and the muting block 360 may similarly reduce the action of the amplitude correction loop when a low value of distortion 360 is detected in the RF output signal 110 (for example, when the distortion 360 is lower than a predetermined threshold). In yet another example, the voltage of the external DC or low frequency power source 120 may be measured to detect whether it is high enough to afford PA 104 sufficient voltage headroom without need for correction, in which case the action of the amplitude correction loop may be reduced similarly. Any of these methods may be used independently or in conjunction with each other as a means to stop or reduce the action of the amplitude correction loop when not needed.

Figure 3B:
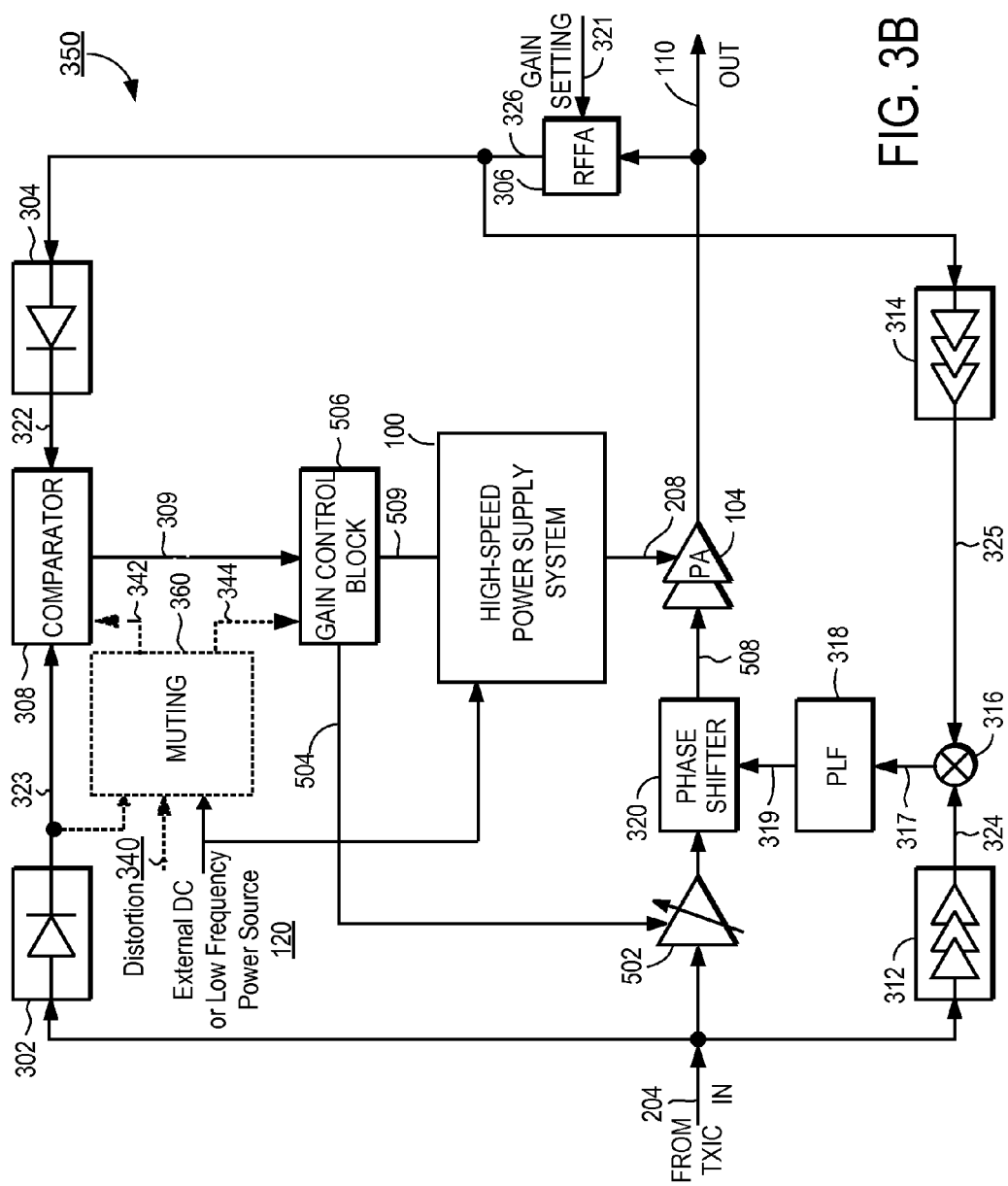
FIG. 3B illustrates a different variation of the power supply system of FIG. 3A for powering an RF PA circuit, according to still another embodiment.

FIG. 3B illustrates a different variation of the power supply system of FIG. 3A for power an RF PA circuit, according to still another embodiment. The power supply system 350 of FIG. 3B is substantially the same as the power supply system 300 described in FIG. 3A, except that a VGA (Variable Gain Amplifier) 502 and a phase control loop have been added to the signal path of PA 104. VGA 502 provides the ability for the amplitude correction loop to additionally correct the RF input amplitude to the PA 104, easing the bandwidth requirements of high-speed power supply system 100. Gain control block 506 apportions at least higher frequency portions 504 of amplitude correction signal 309 to adjust the gain of VGA 502, and also generates the amplitude correction signal 509 to high-speed power supply system 100 as its power control signal 132. Phase shifter 320, together with limiters 312, 314, phase detector 316 and phase loop filter (PLF) 318, provide the phase control loop to correct AM-to-PM (amplitude modulation to phase modulation) distortion created by PA 104. The RF input signal 204 and attenuated output signal 326 are limited to remove amplitude information by limiters 312 and 314, to produce limited signals 324 and 325, respectively. Phase detector 316 compares the phase of limited signal 324 with the phase of limited signal 325, and the resulting phase difference 317 is passed through phase loop filter 318 to generate phase control signal 319. Phase control signal 319 controls phase shifter 320 in a closed-loop fashion to maintain a fixed phase difference between the RF input signal 204 and the RF output signal 110.

Upon reading this disclosure, those of skill in the art will appreciate still additional alternative designs for a high speed power supply system. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the present invention.

What is claimed is:

1. A system for supplying power to a power amplifier (PA) that amplifies a radio frequency (RF) input signal to generate an RF output signal, the system comprising:
    a switching regulator to generate first output power;
    a linear regulator to generate second output power, the linear power supply adapted to shut down responsive to an amplitude of the RF input signal being lower than a threshold; and
    a power combiner circuit to combine the first output power with the second output power to generate a combined output power for the PA, the power combiner circuit comprising a capacitor coupled in series with the second output power from the linear regulator.

2. The system of claim 1, wherein the switching regulator continues to generate the first output power while the linear regulator is shut down.

3. The system of claim 1, further comprising:
circuitry to compare the amplitude of the RF input signal to the threshold and to generate a control signal based on the comparison,
wherein the linear regulator adapted to shut down responsive to the control signal.

4. The system of claim 1, wherein the linear regulator is a push-pull regulator.

5. A system for supplying power to a power amplifier (PA) that amplifies a radio frequency (RF) input signal to generate an RF output signal, the system comprising:
a switching regulator to generate first output power;
a linear regulator to generate second output power, the linear power supply adapted to shut down responsive to an amplitude of the RF input signal being lower than a threshold; and
a power combiner circuit to combine the first output power with the second output power to generate a combined output power for the PA,
wherein the linear regulator generates the second output power based on a difference between a control signal and a feedback signal indicative of the combined output power.

6. The system of claim 5, wherein the switching regulator does not generate the first output power based on the difference between the control signal and the feedback signal indicative of the combined output power.

7. The system of claim 5, wherein the control signal corresponds to an amplitude modulation of the RF output signal.

8. The system of claim 1, wherein the power combiner circuit comprises an inductor coupled in series with the first output power from the switching regulator.

9. A system for supplying power to a power amplifier (PA) that amplifies a radio frequency (RF) input signal to generate an RF output signal, the system comprising:
a switching regulator to generate a first output power;
a linear regulator to generate a second output power, the linear supply adapted to shut down responsive to a shut down control signal received by the linear regulator; and
a power combiner circuit to combine the first output power with the second output power to generate a combined output power for the PA, the power combiner circuit comprising a capacitor coupled in series with the second output power from the linear regulator.

10. The system of claim 9, wherein the switching regulator continues to generate the first output power while the linear regulator is shut down.

11. The system of claim 9, further comprising:
circuitry to compare an indication of the amplitude of the RF input signal to a threshold and to generate the shut down control signal to shut down the linear regulator responsive to the amplitude of the RF input signal being below the threshold.

12. A system for supplying power to a power amplifier (PA) that amplifies a radio frequency (RF) input signal to generate an RF output signal, the system comprising:
a switching regulator to generate a first output power;
a linear regulator to generate a second output power, the linear supply adapted to shut down responsive to a shut down control signal received by the linear regulator;
a power combiner circuit to combine the first output power with the second output power to generate a combined output power for the PA; and
circuitry to compare an indication of distortion of the RF output signal to a threshold and to generate the shut down control signal to shut down the linear regulator responsive to the distortion of the RF output signal being below the threshold.

13. A system for supplying power to a power amplifier (PA) that amplifies a radio frequency (RF) input signal to generate an RF output signal, the system comprising:
a switching regulator to generate a first output power;
a linear regulator to generate a second output power, the linear supply adapted to shut down responsive to a shut down control signal received by the linear regulator;
a power combiner circuit to combine the first output power with the second output power to generate a combined output power for the PA; and
circuitry to determine whether a voltage of the first output power provides voltage headroom and to generate the shut down control signal to shut down the linear regulator responsive to the voltage of the first output power providing voltage headroom.

14. The system of claim 9, wherein the linear regulator is a push-pull regulator.

15. A system for supplying power to a power amplifier (PA) that amplifies a radio frequency (RF) input signal to generate an RF output signal, the system comprising:
a switching regulator to generate a first output power;
a linear regulator to generate a second output power, the linear supply adapted to shut down responsive to a shut down control signal received by the linear regulator; and
a power combiner circuit to combine the first output power with the second output power to generate a combined output power for the PA,
wherein the linear regulator generates the second output power based on a difference between a control signal and a feedback signal indicative of the combined output power.

16. The system of claim 15, wherein the switching regulator does not generate the first output power based on the difference between the control signal and the feedback signal indicative of the combined output power.

17. The system of claim 15, wherein the control signal corresponds to an amplitude modulation of the RF output signal.

18. The system of claim 9, wherein the power combiner circuit comprises an inductor coupled in series with the first output power from the switching regulator.

19. A system for supplying power to a power amplifier (PA) that amplifies a radio frequency (RF) input signal to generate an RF output signal, the system comprising:
a power source to generate first output power in a first frequency range;
a power supply to generate second output power in a second frequency range that is different than the first frequency range, the power supply adapted to shut down responsive to an amplitude of the RF input signal being lower than a threshold; and
a power combiner circuit to combine the first output power with the second output power to generate a combined output power for the PA, the power combiner circuit comprising a capacitor coupled in series with the second output power from the power supply.

20. The system of claim 19, wherein the power source continues to generate the first output power while the power supply is shut down.

21. The system of claim 19, further comprising:
circuitry to compare the amplitude of the RF input signal to the threshold and to generate a control signal based on the comparison,
wherein the power supply is adapted to shut down responsive to the control signal.

22. A system for supplying power to a power amplifier (PA) that amplifies a radio frequency (RF) input signal to generate an RF output signal, the system comprising:
a power source to generate first output power in a first frequency range;
a power supply to generate second output power in a second frequency range that is different than the first frequency range, the power supply adapted to shut down responsive to a shut down control signal received by the power supply; and
a power combiner circuit to combine the first output power with the second output power to generate a combined output power for the PA, the power combiner circuit comprising a capacitor coupled in series with the second output power from the power supply.

23. The system of claim 22, wherein the power source continues to generate the first output power while the power supply is shut down.

24. The system of claim 22, further comprising:
circuitry to compare an indication of the amplitude of the RF input signal to a threshold and to generate the shut down control signal to shut down the power supply responsive to the amplitude of the RF input signal being below the threshold.

25. A system for supplying power to a power amplifier (PA) that amplifies a radio frequency (RF) input signal to generate an RF output signal, the system comprising:
a power source to generate first output power in a first frequency range;
a power supply to generate second output power in a second frequency range that is different than the first frequency range, the power supply adapted to shut down responsive to a shut down control signal received by the power supply;
a power combiner circuit to combine the first output power with the second output power to generate a combined output power for the PA; and
circuitry to compare an indication of distortion of the RF output signal to a threshold and to generate the shut down control signal to shut down the power supply responsive to the distortion of the RF output signal being below the threshold.

26. A system for supplying power to a power amplifier (PA) that amplifies a radio frequency (RF) input signal to generate an RF output signal, the system comprising:
a power source to generate first output power in a first frequency range;
a power supply to generate second output power in a second frequency range that is different than the first frequency range, the power supply adapted to shut down responsive to a shut down control signal received by the power supply;
a power combiner circuit to combine the first output power with the second output power to generate a combined output power for the PA; and
circuitry to determine whether a voltage of the first output power provides voltage headroom and to generate the shut down control signal to shut down the power supply responsive to the voltage of the first output power providing voltage headroom.

* * * * *

UNITED STATES PATENT AND TRADEMARK OFFICE
CERTIFICATE OF CORRECTION

| | | |
|---|---|---|
| PATENT NO. | : 8,866,548 B2 | Page 1 of 1 |
| APPLICATION NO. | : 14/098248 | |
| DATED | : October 21, 2014 | |
| INVENTOR(S) | : Serge Francois Drogi et al. | |

It is certified that error appears in the above-identified patent and that said Letters Patent is hereby corrected as shown below:

In the Claims

Column 6, line 63, replace "linear power supply" with --linear regulator--.

Column 7, line 21, replace "linear power supply" with --linear regulator--.

Column 7, line 45, replace "linear supply" with --linear regulator--.

Column 7, line 66, replace "linear supply" with --linear regulator--.

Column 8, line 14, replace "linear supply" with --linear regulator--.

Column 8, line 31, replace "linear supply" with --linear regulator--.

Signed and Sealed this
Twenty-eighth Day of April, 2015

Michelle K. Lee
*Director of the United States Patent and Trademark Office*